(12) United States Patent
Kang et al.

(10) Patent No.: US 6,624,929 B2
(45) Date of Patent: Sep. 23, 2003

(54) ALL-OPTICAL LOGIC AND OPERATION IN A SOA-BASED MACH-ZEHNDER INTERFEROMETER

(75) Inventors: Byung Kwon Kang, Suwon (KR); Jae Hun Kim, Seoul (KR); Seok Lee, Seoul (KR); Yoon Ho Park, ijungbu (KR); Deok Ha Woo, Seoul (KR); Sun Ho Kim, Koyang (KR); Young Min Jhon, Seoul (KR)

(73) Assignee: Korea Institute of Science and Technology, Seoul (KR)

( * ) Notice: Subject to any disclaimer, the term of this patent is extended or adjusted under 35 U.S.C. 154(b) by 0 days.

(21) Appl. No.: 09/942,686

(22) Filed: Aug. 31, 2001

(65) Prior Publication Data

US 2002/0118441 A1 Aug. 29, 2002

(30) Foreign Application Priority Data

Dec. 19, 2000 (KR) .......................... 2000-78679

(51) Int. Cl.⁷ .............................. H01S 3/00; G02F 3/00
(52) U.S. Cl. ........................ 359/344; 359/108; 359/333
(58) Field of Search ................................ 359/344, 108, 359/107, 900, 333

(56) References Cited

U.S. PATENT DOCUMENTS 5,434,701 A * 7/1995 Fatehi et al. ................ 359/341
5,999,284 A * 12/1999 Roberts ....................... 359/108
6,208,454 B1 * 3/2001 Koren et al. ................. 359/326
6,208,455 B1 * 3/2001 Ueno et al. ................... 359/332
6,424,438 B1 * 7/2002 Byun et al. ................... 359/108

FOREIGN PATENT DOCUMENTS

WO    WO 01/74112 A1 * 10/2001

OTHER PUBLICATIONS

Kang et al, All–Optical Logic AND in a SOA–based Mach–Zehnder All–Optical Wavelength Converter (Nov. 13–16, 2000), IEEE, vol. 1, pp. 117–118.*

Fjelde et al, Demonstration of 20 Gbit/s all–optical logic XOR in integrated SOA–based interferometer wavelength converter (Oct. 26, 2000), Electronic Letters, vol. 36, No 22, pp. 11863–1864.*

* cited by examiner

Primary Examiner—Mark Hellner
(74) Attorney, Agent, or Firm—Greenblum & Bernstein, P.L.C.

(57) ABSTRACT

The present invention relates to the all-optical logic AND operation in a SOA (semiconductor optical amplifier)-based Mach-Zehnder interferometer. More particularly, it relates to the technology making feasible ultra high-speed logic operations while maintaining a small size and a low input power by utilizing a cross-phase modulation (XPM) wavelength converter composed of semiconductor optical amplifiers in the form of a Mach-Zehnder interferometer with nonlinear characteristics.

4 Claims, 2 Drawing Sheets

ALL-OPTICAL LOGIC AND OPERATION IN A SOA-BASED MACH-ZEHNDER INTERFEROMETER

BACKGROUND OF THE INVENTION

1. Field of the Invention

The present invention relates to the all-optical logic AND operation in a SOA (semiconductor optical amplifier) -based Mach-Zehnder interferometer. More particularly, it relates to the technology making feasible ultra high-speed logic operations while maintaining a small size and a low input power by utilizing a cross-phase modulation (XPM) wavelength modulator composed of semiconductor optical amplifiers in the form of a Mach-Zehnder interferometer with nonlinear characteristics.

2. Description of the Related Art

Logic operations based on optics have been receiving a lot of attention as a solution to the limitations of speed and operation capacity of the electronic elements. The ultra high-speed all-optical logic operations take advantage of the nonlinearity of most materials. The logic operations of Sagnac interferometer type, which make use of the nonlinear Kerr effect of optical fibers, have been mainly studied. However, the problem with using the nonlinearity of the optical fibers lies in the fact that one requires a sufficiently large optical intensity and that the size of the circuit has to be large. With the recent announcement of devices such as TOAD (Terahertz optical asymmetric demultiplexer?), which utilizes the nonlinear gain saturation phenomena of the semiconductor optical amplifier, not only has the size been reduced but also the intensity of the optics used was also able to be reduced.

The optical logic operations using an interferometer can be performed not only through the Sagnac interferometer, but also the Mach-Zehnder interferometer, which is composed of waveguides with nonlinear characteristics, and the Michelson interferometer. Therefore, by using an optical device integrated with semiconductor optical amplifiers to carry out logic operations, the reduction in size and power consumption is made possible.

SUMMARY OF THE INVENTION

The idea behind the present invention is the solution of the above stated problem by utilizing a XPM wavelength converter constituted of semiconductor optical amplifiers in the form of a Mach-Zehnder interferometer. This will result in the production of all-optical AND logic operation method by using the SOA-based Mach-Zehnder interferometer, which makes possible an ultra high-speed logic calculator of small size and low input power.

To achieve the above-mentioned goals of the present invention, the invention is constituted of an optical fiber mode-lock laser capable of producing optical pulses for a certain operation speed; an optical attenuator to dampen the optical output; a multiplexer; the optical delay line; a 3-dB optical fiber coupler for splitting the optical intensity 50:50; a polarization controller to attain the polarization that will result in the optimized optical wavelength efficiency; the second optical delay line; an optical isolator transmitting the optical waves; XPM wavelength converter; Erbium doped optical fiber amplifier; optical wavelength filter; and an optical signal analyzer. Wherein the current in the waveguide portion of the XPM wavelength modulator is adequately controlled so that the input signal A is normally outputted as signal C at the output port by controlling the current of the two wave guides which constitute the interferometer. The delay time of signal A is controlled to be synchronized with signal B so that the All-Optical Logic AND operation in a SOA-Based Mach-Zehnder Interferometer is carried out.

BRIEF DESCRIPTION OF THE DRAWINGS

Exemplary embodiments of the present invention will be described in conjunction with the drawings in which.

Figure 1:
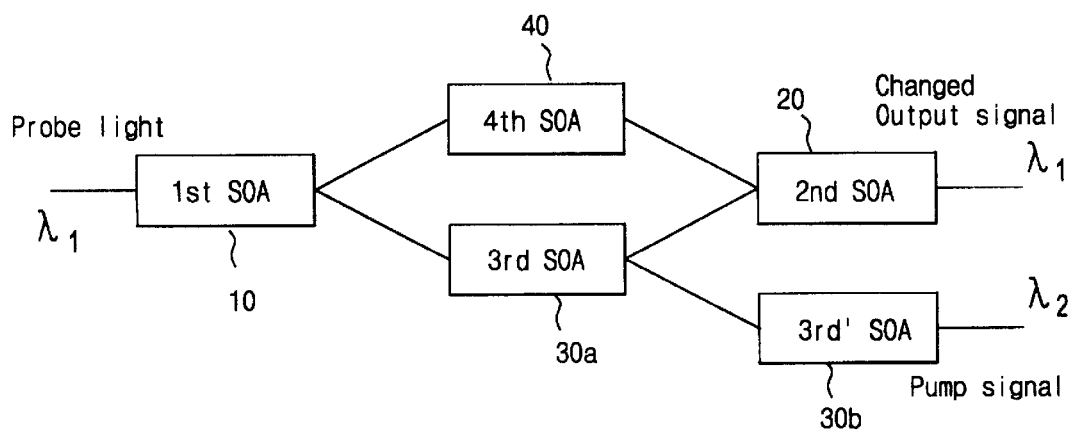
FIG. 1 shows a schematic diagram for the all-optical wavelength modulator according to the present invention of Mach-Zehnder interferometer composed of the semiconductor optical amplifiers.

Explanations for Main Symbols in the Drawings

100: Optical fiber mode-lock laser
120: Optical attenuator
140: Multiplexer
160: First optical delay line
180: 3-dB optical fiber coupler
200: Polarization controller
220: Second optical delay line
240: Optical isolator
260: XPM wavelength converter
280: Erbium doped optical fiber amplifier
300: Optical wavelength filter
320: Optical signal analyzer

DETAILED DESCRIPTION OF THE EMBODIMENTS

Figure 2:
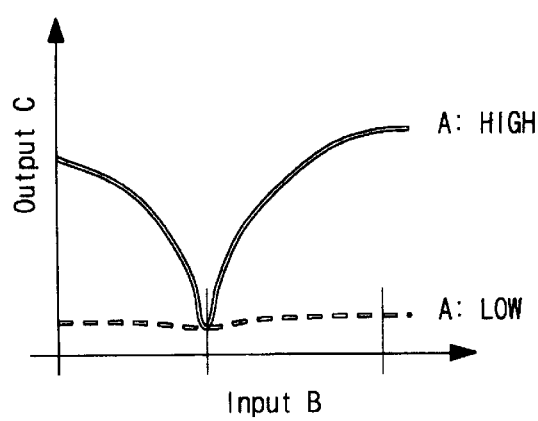
FIG. 2 shows the interference characteristics of the input optical signals from the all-optical interferometer.

FIG. 1 shows a schematic diagram for the all-optical wavelength converter according to the present invention of Mach-Zehnder interferometer composed of the semiconductor optical amplifiers, and FIG. 2 shows the interference characteristics against the intensity of the input signals from the all-optic interferometer. The XPM wavelength converter constituted from the semiconductor optical amplifiers of the Mach-Zehnder interferometer type is illustrated in FIG. 1.

The probe signals of wavelength $\lambda 1$ are amplified at the first SOA (10), and are guided into the two SOAs, the third SOA (30a) and the fourth SOA (40). The pump signals of wavelength $\lambda 2$ with an adequate power are inputted into the pump signal port of the other third SOA (30b), and the nonlinear refraction variation occurs between the two waveguides to create a phase difference in the two waves propagating in the waveguides. At the combination port of the two waveguides a phase difference of 0 or $\pi$ can be inducted so that when an ON/OFF signal of $\lambda 2$ wavelength with different power is given to the pump input port of the other third SOA (30b), the output of the $\lambda 1$ wavelength is outputted in the form of an ON/OFF form of optical signals.

The device which carries out this function is defined as the all-optical wavelength converter transforming the $\lambda 2$ wavelength optical signals into the $\lambda 1$ wavelength optical signals. When the relation between the power of the output signals and that of the pump signals is examined with suitably controlled probe input power levels, the results are shown in FIG. 2. And the corresponding values are as follows in Table 1.

TABLE 1

| Input A | Input B | Output C |
|---------|---------|----------|
| High (1) | Low (0) | Low (0) |
| High (1) | High (1) | High (1) |
| Low (0) | High (1) | Low (0) |
| Low (0) | Low (0) | Low (0) |

Here, let the optical signal inputted into the probe-input port be A and the optical signal inputted into the pump input port be B. When the power level of signal A is at a minimum, the output power maintains a constant level regardless of the power of signal B. This minimum level of signal A could be labeled as logic 0 state of signal A.

When the power level of signal A is at a maximum, this maximum level is defined as logic 1 state of signal A. And the output power changes to a maximum after passing a minimum in accordance with the power of signal B. Here, if the level of signal B, when signal A is minimum, is defined as the logic 0 of signal B, the logic operation is satisfied as shown in Table 1. Under these conditions, when signal A is at logic 1 having an appropriate modulation depth and the intensity of the pump signal B is changed, the outputted signal C becomes of logic 1 if the logic of signal B is 1, and carries out an AND logic operation. In other words C=A·B logic operation is carried out.

Figure 3:
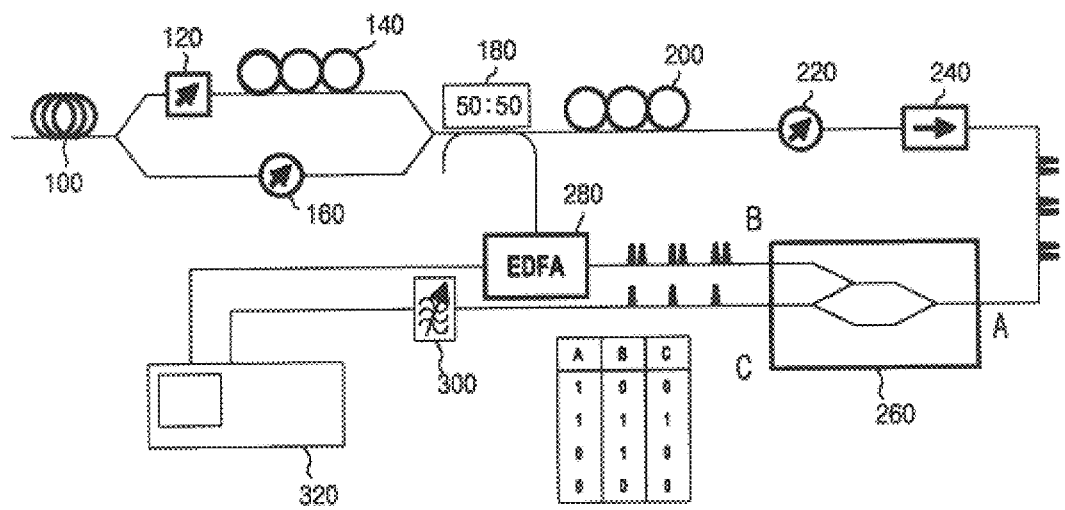
FIG. 3 shows a schematic diagram for the ultra high-speed all-optical logic AND operation according to present invention.
Figure 4:
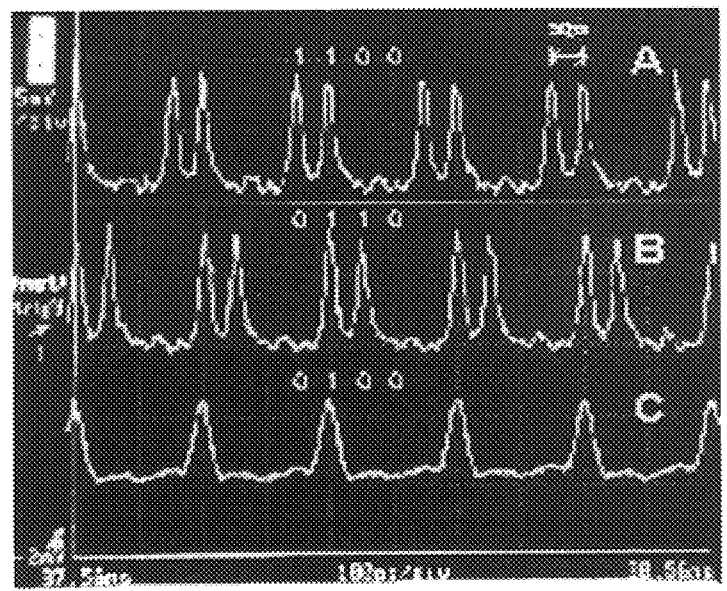
FIG. 4 shows an experimental result of the 20 Gbps ultra high-speed logic AND operation.

FIG. 3 shows a schematic diagram for the ultra high-speed all-optical logic AND operation according to present invention, and FIG. 4 shows an experimental result of the 20 Gbps ultra high-speed logic AND operation.

Analyzing the schematic diagram shown in FIG. 3, the composition consists of the optical fiber mode lock laser (100), the optical attenuator (120) which dampens the optical output, the multiplexer (MUX) (140), the first optical delay line (160) which delays the speed of the optical output, 3-dB optical fiber coupler (180) which separates the optical intensity 50:50, the polarization controller (200) which polarizes the signal to obtain the maximum optical wavelength efficiency, the second optical delay line (220) which delays the speed of the optical output, the optical isolator which transmits the optical waves, XPM wavelength converter (260), the Erbium doped optical fiber amplifier (EDFA) (280), the wavelength filter (300), and the optical signal analyzer (320).

First, to implement the operation speed of tens of Gbps, the optical fiber mode-lock laser (100) is utilized to produce a pulse train having an average optical intensity of 0 dBm with a 5 GHz repetition rate of a pulse width under 20 ps. Then, at the 3-dB optical fiber coupler (180), the signals are divided into 50:50 and one branch of the signals is passed through the polarization controller (200) and the optical attenuator (120). While, the other signal is combined after a 50 ps delay through the first optical delay line (160) to produce a Return-to-Zero (RZ) signal of 20 Gbps level with 1100 pattern. These signals are diverged to pass the polarization controller (200) after passing the first optical delay line (160). This signal A is then inputted into the probe signal input port. And, the diverged 20 Gbps level RZ signals are inputted into the pump input-port as signal B after passing the optical amplifier.

At this time, the current of the semiconductor optical amplifier waveguide is adequately controlled so that the input signal A is normally outputted as signal C at the output port by controlling the current of the two waveguides which constitute the interferometer. The delay time of signal A is controlled to be synchronized with signal B so that signal B becomes either 0110 or 0011 when signal A is 1100.

The results of the completion of the logic AND operation of the 20 Gbps are shown in FIG. 4. Signal A is a mode-lock pulse with a 1100 pattern and signal B becomes the signal that will carry out the logic operation after the same signal is time delayed. The output signal C can be observed to be the result of a clear AND logic operation by operating an AND logic operation between signal A and B.

Here, the line width of output C seems wide. This may be due to the fact that pulse is passed through a wavelength filter of a narrower band width than the line width of the original wavelength in order to eliminate the accompanying amplified spontaneous emission (ASE) from the output of the semiconductor optical amplifying wavelength modulator.

The recovery time from gain saturation phenomena of the optical amplifier, which constitutes the XPM wavelength converter, is reported to be approximately 100 ps. However according to results of the present invention, the signal which was first initiated did not affect the following signal even though the pulse width used in the operation was 50 ps.

As seen above the All-Optical Logic AND operation in a SOA-Based Mach-Zehnder Interferometer has the following advantages. First, the unit logic device is crucial to the implementation of the optical computer, and can be used as the basic element of all-optical signal processing, which can overcome the speed limitation of ultra high-speed optical communication. Second, since the present invention utilizes the nonlinear characteristics of the semiconductor element, the ability to handle optical signals as a single element through integration process can be assigned. This type of optical signal processing technology can miniaturize the optical computer, which will become the basis for ultra high-speed optical communications and data processing in near future.

While the foregoing invention has been described in terms of the embodiments discussed above, numerous variations are possible. Accordingly, modifications and changes such as those suggested above, but not limited thereto, are considered to be within the scope of the following claims.

What is claimed is:

1. A system for implementing an All-Optical Logic AND operation in a SOA-Based Mach-Zelinder Interferometer, comprising:

an optical fiber mode-lock laser that produces optical signals for a predetermined operation speed;

an optical attenuator that dampens the optical signals;

a multiplexer;

a first optical delay line that delays a speed of the signals;

a 3-dB optical fiber coupler that separates optical intensity of the signals 50:50;

a polarization controller that polarizes a first branch of the signals to obtain an optimized optical wavelength efficiency;

a second optical delay line that delays a speed of the polarized signals;

an optical isolater that transmits optical waves;

a cross-phase modulation (XPM) wavelength converter, comprising a plurality of wave guides;

an Erbium doped optical fiber amplifier that receives a second branch of the signals via the optical fiber coupler;

an optical wavelength filter that filters the output of the XPM wavelength converter; and an optical signal analyzer;

wherein an input signal A is normally outputted as an output signal C by controlling a current of the plurality of wave guides of the XPM wavelength converter; and wherein a delay time of the input signal A is controlled via the second optical delay line to be synchronized with an input signal B, from the Erbium doped optical fiber amplifier, so that the logic AND operation between the input signal A and the input signal B is performed.

2. The system for implementing the All-Optical Logic AND operation in a SQA-Based Mach-Zehnder Interferometer according to claim 1, wherein the XPM wavelength converter produces return-to-zero type pulse data signals.

3. The system for implementing the All-Optical Logic AND operation in a SOA-Based Mach-Zehnder Interferometer according to claim 1, wherein a logic of the input signal B becomes one of 0110 and 0011 when a logic of the input signal A is 1100.

4. The system for implementing the All-Optical Logic AND operation in a SOA-Based Mach-Zehnder Interferometer according to claim 1, wherein a level of the input signal B is a logic 0 when the output of the interferometer becomes a minimum, and is a logic 1 when the output becomes a maximum.

* * * * *

UNITED STATES PATENT AND TRADEMARK OFFICE
CERTIFICATE OF CORRECTION

PATENT NO. : 6,624,929 B2  Page 1 of 1
DATED : September 23, 2003
INVENTOR(S) : B.K. Kang et al.

It is certified that error appears in the above-identified patent and that said Letters Patent is hereby corrected as shown below:

Column 5,
Line 11, "SQA" should be -- SOA --.

Signed and Sealed this

Fifteenth Day of June, 2004

JON W. DUDAS
*Acting Director of the United States Patent and Trademark Office*